(12) United States Patent
Fensterle

(10) Patent No.: US 10,931,279 B2
(45) Date of Patent: Feb. 23, 2021

(54) BATTERY-OPERATED ELECTRONIC SWITCHING DEVICE HAVING A POWER-FREE STAND-BY MODE

(71) Applicant: IFM ELECTRONIC GMBH, Essen (DE)

(72) Inventor: Rolf Fensterle, Ravensburg (DE)

(73) Assignee: IFM ELECTRONIC GMBH, Essen (DE)

( * ) Notice: Subject to any disclaimer, the term of this patent is extended or adjusted under 35 U.S.C. 154(b) by 24 days.

(21) Appl. No.: 16/464,046

(22) PCT Filed: May 29, 2018

(86) PCT No.: PCT/EP2018/063999
§ 371 (c)(1),
(2) Date: May 24, 2019

(87) PCT Pub. No.: WO2018/224352
PCT Pub. Date: Dec. 13, 2018

(65) Prior Publication Data
US 2019/0386659 A1    Dec. 19, 2019

(30) Foreign Application Priority Data
Jun. 9, 2017    (DE) .................... 10 2017 209 734.5

(51) Int. Cl.
*H03K 17/785*    (2006.01)
*G01F 23/00*    (2006.01)
(Continued)

(52) U.S. Cl.
CPC ....... *H03K 17/785* (2013.01); *G01F 23/0061* (2013.01); *G01F 23/263* (2013.01);
(Continued)

(58) Field of Classification Search
None
See application file for complete search history.

(56) References Cited

U.S. PATENT DOCUMENTS

| 4,268,843 A | 5/1981 | Brown et al. |
| 4,827,244 A * | 5/1989 | Bellavia ............... G08B 29/145 |
| | | 340/514 |
| 2016/0170394 A1 | 6/2016 | Allgaier et al. |

FOREIGN PATENT DOCUMENTS

| DE | 19839000 A1 | 3/2000 |
| DE | 102010004099 A1 | 4/2011 |
(Continued)

*Primary Examiner* — Kenneth B Wells
(74) *Attorney, Agent, or Firm* — Harness, Dickey & Pierce, P.L.C.

(57) ABSTRACT

Battery-powered electronic switching device comprising a powerless standby mode, including a sensor, a controller, a battery and a wireless communication module, wherein the controller can be activated via a switching transistor connected to the battery, wherein the switching transistor for activation can be set into a conductive state upon impinging light on a photoreceiver, wherein the control terminal of the switching transistor is connected to the controller so that it can remain permanently conductive, wherein the photoreceiver comprises a cover, which is suitable for influencing the incidence of light, and the controller comprises means for switching off the switching transistor in order to set the electronic switching device after a successful test, in response to a control command or after a predetermined period of time into the powerless standby mode.

7 Claims, 1 Drawing Sheet

Figure 1:
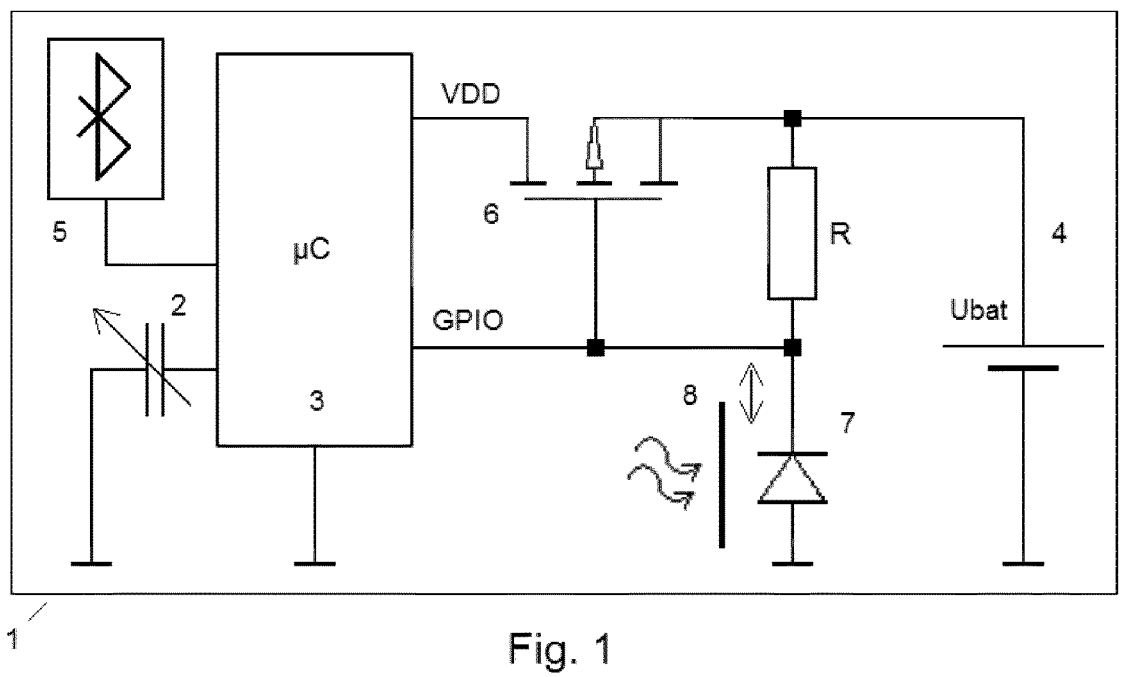

(51) Int. Cl.
*G01F 23/26* (2006.01)
*G08C 17/02* (2006.01)
(52) U.S. Cl.
CPC ..... *G08C 17/02* (2013.01); *H03K 2217/0036* (2013.01); *H03K 2217/0063* (2013.01)

(56) References Cited

FOREIGN PATENT DOCUMENTS

| | | |
|---|---|---|
| DE | 102015223868 A1 | 6/2017 |
| EP | 2267649 A1 | 12/2010 |
| FR | 2725084 A1 | 3/1996 |
| WO | 2010106113 A2 | 9/2010 |
| WO | 2015001064 A1 | 1/2015 |

\* cited by examiner

BATTERY-OPERATED ELECTRONIC SWITCHING DEVICE HAVING A POWER-FREE STAND-BY MODE

CROSS-REFERENCE TO RELATED APPLICATIONS

This application is a National Stage of International Application No. PCT/EP2018/063999 filed on May 29, 2018. This application claims the priority to German Patent Application No. 10 2017 209 734.5, filed on Jun. 9, 2017. The entire disclosures of the above applications are incorporated herein by reference.

FIELD

The disclosure relates to a battery-powered electronic switching device, in particular a capacitive point level switch comprising a powerless standby mode.

BACKGROUND

This section provides background information related to the present disclosure which is not necessarily prior art.

Capacitive filling level meters are used to determine a filling level of electrically non-conductive bulk materials or liquids by means of a capacitive measuring sensor.

In addition to immersing measuring devices, which of course offer a higher measuring accuracy, devices are known that can measure through a non-conductive container wall. Such devices are manufactured by the applicant and placed on the market in various designs.

For larger containers and in large-scale systems the wiring of the switching devices is associated with a considerable effort.

DE 19839000 A1 discloses a battery-powered filling level sensor which detects the filling level through a container wall and forwards it via a radio link to a display and evaluation unit. As an energy source a 9V block battery is mentioned. It is proposed to dispose the evaluation electronics together with the battery supply in a separate housing at or next to the tank and to connect the sensor via a two-core connecting line. The associated assembly and wiring effort are considered as disadvantageous.

DE 10 2010 004099 A1 discloses an electronic switching device comprising an energy-free standby mode, wherein the activation is effected by means of a radio signal in which a control signal and energy are transmitted simultaneously. The associated equipment expense, the volume requirements and costs are considered as disadvantageous.

WO 2010 106113 A2 discloses a battery-powered electronic device comprising a powerless standby operation, wherein a field effect transistor is activated by means of a remote control, which is done with the aid of photodiodes or a phototransistor arranged between gate and source. The use of a remote control, which, if not already present, represents a significant cost factor, is considered as disadvantageous.

WO 2015 001064 A1 describes a measuring device comprising a transmission device, wherein a switch or a pushbutton is provided, which actuates this bridging device. The pushbutton can be configured as a light barrier and is used to switch off power-intensive arithmetic operations in order to operate a computing unit in power-saving standby modes.

The cost of materials and the lack of complete separation from the power supply or battery not mentioned in this document are considered as disadvantageous.

SUMMARY

This section provides a general summary of the disclosure, and is not a comprehensive disclosure of its full scope or all of its features.

It is the object of the disclosure to provide an activation option for a battery-powered electronic switching device comprising a powerless standby mode, which can be activated without additional auxiliary means such as an infrared remote control or the like, and which after a functional test can be reset to the powerless standby mode. Moreover, it should also be easy to handle and be cost effective.

The object of the disclosure is achieved with the characterizing features of claim 1. The dependent claims relate to the advantageous embodiment of the disclosure.

A first inventive idea is to generate the light signal by removing a light-opaque cover over the photoreceiver from the ambient light at workplace lighting of typically 500 lux or a spectrally adjusted light source of sufficient intensity such as a flashlight or a smartphone.

A second inventive idea is to additionally connect a (field effect) transistor controlled in a known manner by a photoreceiver to a microcontroller which is able to control, in particular block, the transistor in the absence of a light signal.

Since the electronic switching device is to be hermetically sealed, which makes a battery replacement virtually impossible, the powerless standby operation is particularly important here.

In order to achieve that the discharge of the battery starts only with the initial setup at the operation site, an opaque cover, such as an adhesive film, is attached over the photoreceiver, wherein with the removal of the cover the bistable circuit irreversibly passes into its active state, which would easily be possible with a conventional flip-flop, too. However, the switching device should be tested prior to delivery to the customer, which would require a second control input to reset the flip-flop.

Therefore, the control input of the transistor (gate) according to the disclosure is additionally connected to a microcontroller or another suitable control unit, whereby the switching device after a successful test, a key input or after elapse of a predetermined period of time can be reset into the powerless standby mode when the photoreceiver is covered again.

The advantage is that a factory test can be done prior to the delivery of the switching device without dispensing with the advantageous powerless standby mode. Thus, the battery is not prematurely discharged even in case of a prolonged storage at the customer site.

By use of a modular system in which point level switches according to the disclosure comprising only one measuring electrode and a binary switching output are used, their process values can be transmitted via the wireless communication module to a point limit switch operating as a master, wherein the filling level is either determined by itself or the measured values required therefor are transmitted via a wired interface to a central unit. By means of interpolation and subtraction a filling level measurement (filling level) can be generated.

The disclosure will be explained in more detail with reference to the drawings.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
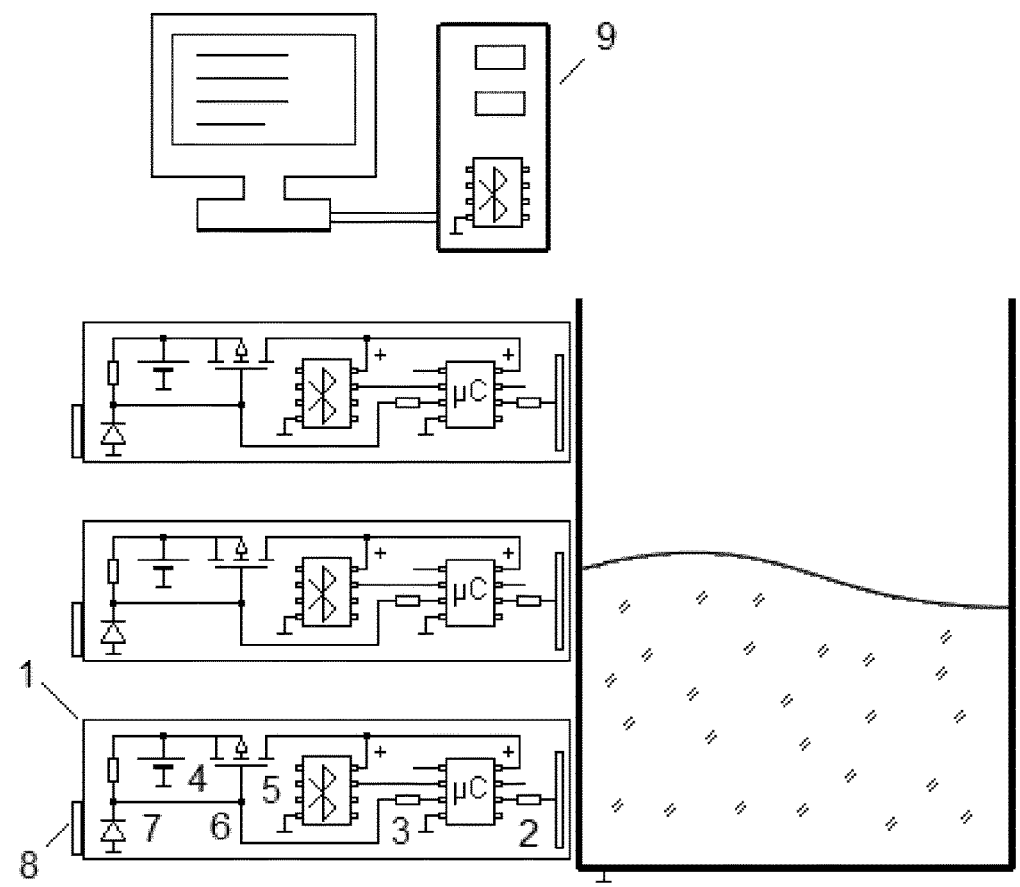

FIG. 1 shows the essential components of a capacitive switch according to the disclosure; and FIG. 2 shows three capacitive switching devices according to the disclosure disposed at a tank.

Corresponding reference numerals indicate corresponding parts throughout the several views of the drawings.

DETAILED DESCRIPTION

Example embodiments will now be described more fully with reference to the accompanying drawings.

FIG. 1 shows the essential components of the capacitive switch according to the disclosure, in which a measuring electrode 2 shown as a variable capacitance forms an AC circuit with the housing wall, the wall of a tank shown in FIG. 2 accommodating a medium and the device mass, wherein the impedance of the AC circuit is evaluated in a known way.

The measuring electrode 2 is fed directly with a square wave signal from the microcontroller 3. The components for evaluating the impedance which are not essential for the disclosure are not shown here.

This arrangement is powered by a battery 4 integrated in the device, which can neither be replaced nor recharged without damaging the housing. In the rest state the battery 4 is loaded only with the residual currents of the darkened photodiode 7 and the general-purpose input/output (GPIO) of the microcontroller 3. These currents are so small that the influence of a resistance R lying in the megohm range can practically be ignored.

The switching transistor 6 which is normally blocked in the rest state, a PMOS of the type FDZ661PZ, is activated upon exposure of the photodiode 7 (BPW34), which may be done by removing a reversible cover 8, for example a label, or a flash of light penetrating the housing wall.

As a photoreceiver also a phototransistor (BPX38) or a number of photovoltaically operated photodiodes come into question, wherein the photodiodes would have to be arranged in place of the resistor R.

The photocurrent of the photodiode 7 operated in the reverse direction opens the switching transistor 6, which powers and thus activates the microcontroller 3. If the ambient light (workplace lighting) is insufficient, a spectrally adjusted light source of sufficient intensity, such as a flashlight or a smartphone, can be used, too.

The GPOI of the microcontroller 3 now takes over the control of the switching transistor 6, so that the device after a successful test and rearranging the cover of the photoreceiver can be reset into the powerless standby mode.

The wireless communication module 5, shown is a Bluetooth communication module, takes over the communication with a central unit 9, which incidentally can also transmit a command for switching off the self-holding switching transistor 6.

FIG. 2 shows electronic switching devices 1 according to the disclosure disposed at a tank. They are constructed identically and connected via wireless Bluetooth communication modules 5 to a Bluetooth master in a central unit 9.

Their measuring electrodes 2 feed, as described above, an AC circuit influenced by the tank and its contents, wherein the impedance of the AC circuit can be evaluated in a known manner.

The capacitive point level switches 1 initially set in a powerless standby mode are activated by means of a light signal impinging on the photoreceiver 7 and then pass over according to the disclosure into a light-independent self-holding mode and thus into their operating state.

This can be terminated again, for example, after completion of a functional test or a temporary deactivation of the measuring system, by a control command generated by the microcontroller 3 or transmitted by the central unit 9.

In an advantageous embodiment, moreover, process values of the measuring electrodes 2 can be transmitted to the central unit 9 via the Bluetooth communication module 5 (Bluetooth interface), for example a Bluetooth module RN4020-V/RM120 or the like.

The master 9 is connected to a PC via a wired bidirectional communication interface, without limiting the disclosure thereto.

During the evaluation, an interpolation of the process values, for example a spline interpolation, can be carried out, wherein the geometric arrangement of the point level limit switches 1, i.e. their mutual distance and the geometry of their measuring electrodes, are taken into account, too. The maximum value of the derivative indicates the location of the largest change in process values and thus the actual filling level.

In a further embodiment, the process values can be normalized and then subtracted point by point from each other. The differences are compared with each other, and the adjacent point level limit switches 1 with the largest difference value are determined. After a final interpolation of these process values a filling level measurement value can be determined and displayed digitally.

The cover 8 may be a daylight-opaque housing portion which, for example, includes fluorescent components which can be activated by a flash of light in the blue or violet spectral region.

The disclosure is also suitable for capacitive sensors with multiple electrodes, inductive, magnetic, optical or ultrasonic sensors.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A battery-powered electronic switching device comprising a powerless standby mode, including a sensor, a controller, a battery and a wireless communication module, wherein the controller can be activated via a self-holding switching transistor connected to the battery, wherein the self-holding switching transistor for activation is set into a conducting state by means of light impinging on a photoreceiver, wherein a control terminal of the self-holding switching transistor is connected to the controller such that it can remain permanently conductive;

wherein the photoreceiver comprises a cover which is suitable for influencing the incidence of light, and the controller comprises means for switching off the self-holding switching transistor, which can reset the electronic switching device after a successful test, in response to a control command or after elapse of a predetermined period of time into the powerless standby mode, wherein the controller is disconnected from the battery by the self-holding switching transistor.

2. The electronic switching device according to claim 1, wherein its housing is hermetically sealed and the battery cannot be replaced without damaging the housing.

3. The electronic switching device according to claim 1, wherein the photoreceiver is activated by removing the cover.

4. The electronic switching device according to claim 1, wherein the photoreceiver is activated by a flash of light penetrating the cover.

5. The electronic switching device according to claim 1, wherein it can be set into the powerless standby mode by a control command transmitted from a central unit.

6. An arrangement for capacitive determination of a filling level in a tank comprising more than two identical battery-powered electronic switching devices according to claim 1, which are connected to a central unit via a radio link and process values of which are transmitted via the communication module, wherein a binary or a digital filling level signal is generated from the process values.

7. An arrangement for capacitive determination of a filling level in a tank comprising more than two identical battery-powered electronic switching devices,
  each of the battery-powered electronic switching devices having a powerless standby mode and including a sensor, a controller, a battery and a wireless communication module, wherein the controller can be activated via a switching transistor connected to the battery, wherein the switching transistor for activation is set into a conducting state by means of light impinging on a photoreceiver, wherein the control terminal of the switching transistor is connected to the controller such that it can remain permanently conductive;
  wherein the photoreceiver comprises a cover which is suitable for influencing the incidence of light, and the controller comprises means for switching off the switching transistor, which can reset the electronic switching device after a successful test, in response to a control command or after elapse of a predetermined period of time into the powerless standby mode, wherein the controller is disconnected from the battery by the switching transistor,
  wherein the battery-powered electronic switching devices are connected to a central unit via a radio link and process values of which are transmitted via the communication module, wherein a binary or a digital filling level signal is generated from the process values.

* * * * *